United States Patent [19]

Birch et al.

[11] Patent Number: 4,949,038
[45] Date of Patent: Aug. 14, 1990

[54] OPTICAL FIBER HAVING A HELICAL CORE FOR SENSING A MAGNETIC FIELD

[75] Inventors: Robin D. Birch, West End; David N. Payne, Bursledon; Malcolm P. Varnham, Hitchin, all of England

[73] Assignee: National Research Development Corporation, London, England

[21] Appl. No.: 333,783

[22] Filed: Apr. 5, 1989

Related U.S. Application Data

[63] Continuation of Ser. No. 161,246, Feb. 19, 1988, abandoned, which is a continuation of Ser. No. 63,722, Jun. 16, 1987, abandoned, which is a continuation of Ser. No. 812,725, Dec. 23, 1985, abandoned.

[30] Foreign Application Priority Data

Dec. 21, 1984 [GB] United Kingdom ............ 8432402

[51] Int. Cl.$^5$ ............................................ G01R 33/032
[52] U.S. Cl. ................................ 324/244; 250/227.17; 350/96.29; 356/345; 356/351; 324/96; 324/117 R
[58] Field of Search ............... 324/244, 260, 263, 200, 324/96, 117 R; 250/227, 227.14, 227.17; 350/96.15, 96.16, 96.17, 96.29; 65/3.11; 356/345, 351; 332/7.51

[56] References Cited

U.S. PATENT DOCUMENTS

| | | | |
|---|---|---|---|
| 3,605,013 | 9/1971 | Yoshikawa et al. | 324/96 |
| 3,950,073 | 4/1976 | Horiguchi et al. | 350/96.32 X |
| 4,099,835 | 7/1978 | French et al. | 350/96.3 |
| 4,227,771 | 10/1980 | Nolan | 350/96.3 X |
| 4,268,818 | 5/1981 | Davis et al. | 340/870.17 X |
| 4,298,245 | 11/1981 | Aulich et al. | 324/96 X |
| 4,319,186 | 3/1982 | Kingsley | 324/96 |
| 4,348,587 | 9/1982 | Tangonan et al. | 324/244 X |
| 4,370,612 | 1/1983 | Puech et al. | 324/117 R |
| 4,372,645 | 2/1983 | Miller | 350/96.3 |
| 4,420,752 | 12/1983 | Davis et al. | 340/870.17 |
| 4,442,350 | 4/1984 | Rashleigh | 324/96 X |
| 4,450,406 | 5/1984 | Bobb | 324/244 X |
| 4,477,723 | 10/1984 | Carome et al. | 324/96 X |
| 4,563,639 | 1/1986 | Langeac | 324/96 |
| 4,603,941 | 8/1986 | Fujii et al. | 350/96.3 X |
| 4,615,582 | 10/1986 | Lefevre et al. | 324/244 X |

FOREIGN PATENT DOCUMENTS

| | | | |
|---|---|---|---|
| 44572 | 1/1982 | European Pat. Off. | 324/244 |
| 0108671 | 10/1983 | European Pat. Off. | |
| 189568 | 11/1983 | Japan | 324/244 |
| 2033601 | 5/1980 | United Kingdom | |
| 1588012 | 4/1981 | United Kingdom | |
| 2102762 | 1/1983 | United Kingdom | |
| 2104213 | 3/1983 | United Kingdom | |
| 2119536 | 11/1983 | United Kingdom | |
| 2125960 | 3/1984 | United Kingdom | 324/244 |

Primary Examiner—Reinhard J. Eisenzopf
Assistant Examiner—Warren S. Edmonds
Attorney, Agent, or Firm—Cushman, Darby & Cushman

[57] ABSTRACT

A sensor for sensing magnetic fields. A single mode optical fiber has a core which is wound into a helical shape. The fiber is formed with a former and a core, and the core is preferably attached to the inner surface of the former and wound into a helical shape tracing its inner periphery. The core is also offset from the central axis of the fiber former.

6 Claims, 2 Drawing Sheets

OPTICAL FIBER HAVING A HELICAL CORE FOR SENSING A MAGNETIC FIELD

This is a continuation of application Ser. No. 07/161,246, filed Feb. 19, 1988, which was abandoned upon the filing hereof; which was a continuation of application Ser. No. 07/063,722, filed June 16, 1987, abandoned; which was a continuation of application Ser. No. 06/812,725 filed Dec. 23, 1985, abandoned.

This invention relates to optical fibres and, in particular, to methods of manufacture of optical fibres exhibiting high circular birefringence. It also includes the use of such fibres in measuring devices and finds a special application in apparatus for measuring electric current.

Electric-current monitors are widely employed in the electricity generating industries to determine the effects of loads on the grid. Conventionally, these measurements are made using large high voltage current transformers which require extensive insulation and are therefore expensive and bulky. Moreover, the bandwidth of the measurement system is low, making the monitoring of fast transients (e.g. lightning strikes) difficult. There is therefore a requirement for a cheaper and simpler alternative. Such an alternative is provided by an optical-fibre current monitor which requires little or no insulation because the optical fibre is a dielectric and therefore does not conduct electricity. The sensor arm is a fibre, which being light and flexible, is simple and convenient to employ. Such a monitor has a large bandwidth which facilitates the monitoring of very fast transients on the grid.

The optical-fibre current monitor is based on the Faraday effect—the rotation of linearly-polarised light which occurs in various materials when a magnetic field is aligned with the direction of light propagation. Such a magnetic field exists around a wire carrying electric current. This magnetic field is circular and directional and by Amperes Law, the line integral of the field gives the current flowing. In a simple current monitor, a single mode optical fibre is wound once around the wire. Polarised light is launched into the fibre. When the electric current is turned on, its associated magnetic field interacts with the light propagating through the fibre via the Faraday effect and results in a rotation of the polarisation of the light output from the fibre. The light is still linearly polarised, but the polarisation is rotated by an amount proportional to the line integral of the electric current contained within the single loop of fibre. The amount of rotation depends only on the net electric current contained within the loop and is unaltered by the shape of the loop and by the presence of magnetic fields associated with electric currents carried by wires outside the loop, no matter how close they approach. Instruments of greater sensitivity are provided by winding the fibre a multiplicity of times around the wire. If, in addition the light is now reflected back down the fibre, using, for example, a mirror at the far end, the rotation is then doubled. This is often a convenient implementation, since the fibre can be wound or unwound from the conductor at will.

Unfortunately, however, practical single-mode optical fibres are linearly birefringent as a result of core ellipticity or asymetric stress. This means that the fibre supports two orthogonally polarised modes whose propagation constant spacing is equal to the birefringence $\Delta\beta$. The state of polarisation of light evolves periodically along the fibre with a beat length $Lp=2\pi\Delta\beta$. The consequence of this is that the linear birefringence quenches (or at best distorts) the small Faraday rotation, thus making the optical-fibre current monitor inoperative. In effect, the maximum interaction length of the light with the magnetic field is limited to $Lp/2$, where $Lp$ is typically 1-10 m. Since on high voltage conductors it is necessary to use fibre loop diameters of around 1 meter, fibre linear birefringence severely limits the number of turns which can be used.

One solution to this problem is to increase $Lp$ by producing a low-birefringence fibre. This has been achieved by producing a very-nearly perfect circular fibre, or by twisting the fibre after it has been drawn, or by spinning the preform during the fibre drawing process to produce the spun fibre.

Both the twisted and the spun fibres can be visualised as many sections of linearly-birefringent fibres in which each section cancels out the birefringence of the previous section. Thus the total linear-birefringence averages out to almost zero and this completely eliminates the problem of the intrinsic fibre birefringence. However, this approach is not a complete solution as there are other sources of birefringence extrinsic to the fibre, namely bends and transverse pressure. Thus when the low-birefringence spun-fibre is packaged into a cable or coil, the birefringence reappears and dominates the current measurement.

We have found that by appropriate configuration and selection of fibres it is possible to overcome these difficulties.

Accordingly, the present invention provides apparatus sensitive to a magnetic field comprising a single-mode optical fibre the axis of which is disposed in a helix.

The invention further provides a method of manufacture of a highly circularly-birefringent optical fibre by spinning an optical fibre preform comprising an offset core mounted on a supporting tube, during a fibre drawing process.

An embodiment of the invention will now be described by way of example with reference to the accompanying drawings, in which, FIG. 1 shows a fibre with a helical core.

Figure 1:
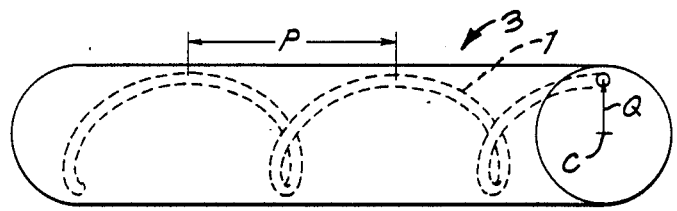

Referring now to the drawings, a circularly birefringent fibre structure 3 with a helical waveguiding region 1 through which the light is propagated is shown schematically in FIG. 1. The helix has a pitch length P and an offset Q, from a central axis C of the fiber structure 3. In a practical circularly-birefringent fibre, P may be in the range 0.1 mm–10 mm and Q may be some value larger than about 10 µm. If the waveguiding region 1 of the fibre is completely isotropic and no stresses, torsions or linear form-birefringence exist, when linearly-polarised light is launched into the waveguiding region 1 it will be found that the polarisation of the output light is also linear. In the special case where the helix forming the waveguiding region 1 contains an integral number of pitches, the direction of light propagation at the output of the waveguiding region 1 is parallel to that at the input. However, it is found that the orientation of the output linearly-polarised light is rotated with respect to that at the input of the waveguiding region 1. The effect arises purely from geometrical considerations and occurs because, in general, linearly-polarised light cannot follow a non-planar curve (such as found in a helix) without rotating, i.e. the light remains linearly polarised but the direction of the polarisation rotates. Since a rotation of linearly-polarised light can be equated to circular birefringence, it follows that fibre structures with helical waveguiding regions are circularly birefringent.

Figure 2:
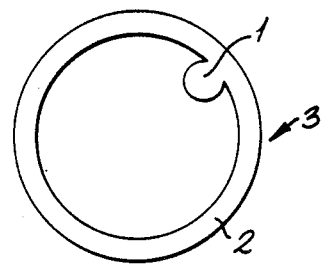
FIG. 2 shows a cross-section of a helical core fibre.

We have made circularly-birefringent fibre structures with helical waveguiding regions with sufficient circular birefringence to make them suitable for the current monitor. FIG. 2 shows a cross-section of a fibre structure with sufficient circular birefringence to make it suitable for use as a current monitoring device. The fibre structure 3 comprises a silica capillary 2 which serves as a fibre former, on the inside of which is attached a core/cladding waveguiding region 1. The cross-section of the preform from which the fibre structure 3 was made also resembles FIG. 2.

The fibre structure 3 including helical waveguiding region 1 was made from a special preform 3' (FIG. 4) by spinning the preform 3' during the fibre-drawing process. A suitable spinning process is disclosed in UK Patent Application 2101762A.

Figure 4:
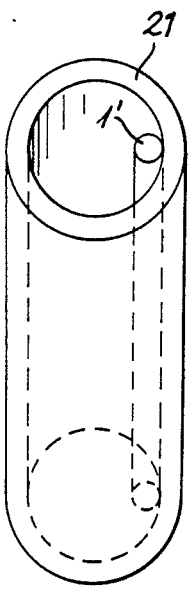
FIG. 4 shows the mounting of an oiptical fibre preform inside a tube.
Figure 5:
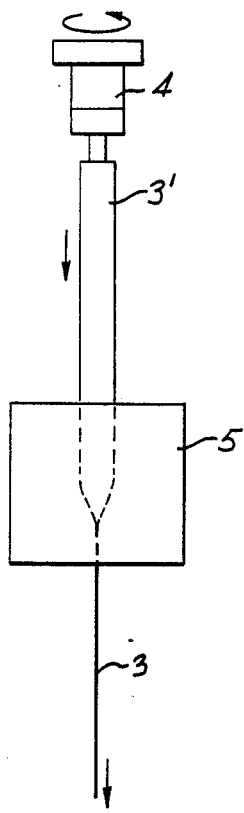
FIG. 5 shows the drawing of a fibre using a rotating chuck.

A small diameter conventional core/cladding preform 1' (e.g. of 5 mm diameter) is produced by a conventional preform manufacturing process, such as chemical vapour deposition. It is then placed inside a glass tube 2' of typically 25 mm bore and attached to the side (FIG. 4). The structure 3' thus obtained constitutes a new composite preform 3' having an offset internal preform 1' inside. The preform 3 is held in a rotating chuck 4, FIG. 5, which is driven by a motor, and fed into a furnace 5 at a controlled rate. The fibre structure 3 is pulled from the composite preform 3' using conventional fibre-pulling techniques at a typical rate of 2 m/min, while a preform rotation rate of typically 1,000 r.p.m. is used. Care is taken to keep the fibre hollow and to preserve the initial preform geometry. This can be achieved by pulling at a low temperature to reduce the risk of viscous flow. FIG. 2 shows the cross-section of the resulting fibre structure 3. It is hollow and consists of an almost circular glass wall on which lies the waveguiding region. The offset of the waveguiding region 1 is about 100 μm and the pitch of the resulting helix is about 2 mm. The pitch can be varied by changing the ratio of the preform spinning rate to the fibre drawing speed. The fibre structure 3 shown in FIG. 2 exhibited a complete rotation (i.e. 360°) of the plane of polarisation in a 90 mm length. To achieve such an optical rotation using a twisted fibre would require about 152 twists/meter, a figure which exceeds the practical limit.

The preform could equally well have been solid and-/or the waveguiding region could have been located directly on or in the outside wall of the capillary. The fibre structure could, in addition, be coated in-line with any of the various coatings suitable for optical fibres.

The performance of the fibre structure of this embodiment can be used with core offsets of 200–300 μm, but can be improved by increasing the offset of the waveguiding region to, say, 300 μm and using a 1–3 mm pitch. Under these conditions, it is estimated that the fibre structure will then have higher circular-birefringence, corresponding to a complete optical rotation in a length of 1–30 mm. It has in fact proved possible to fabricate a fibre with a rotation length as short as 15 mm.

The performance of the fibre structure is limited by the smallest radius of curvature experienced by the waveguiding region before it suffers significant bend loss. This problem can be alleviated by increasing the core/cladding index difference of the initial conventional internal preform.

In a further embodiment, a fibre structure with a helical waveguiding region is produced by winding on a mandrel.

Figure 6:
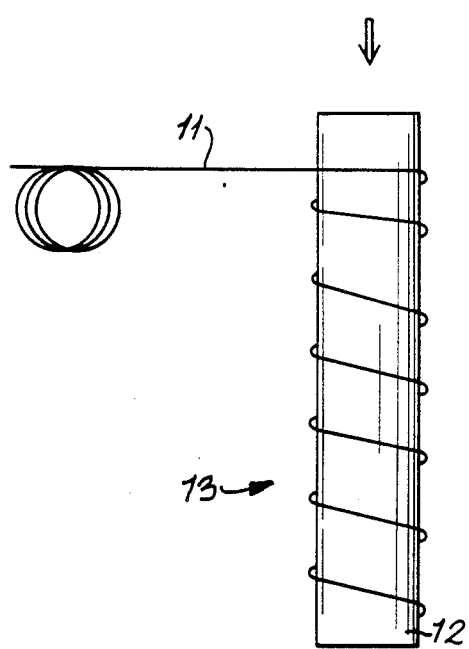
FIG. 6 shows the winding of a fibre on a mandrel.

FIG. 6 shows a conventional fibre 11 being wound on a central member 12 which serves as the fibre former in this embodiment. The central member 12 is continuously rotated and traversed along. While this is occurring the fibre 11 is being fed on to the member 12, either from a feed spool or directly during the fibre drawing process. The result is a structure 13 with a helical waveguiding region. It should be noted here that the central member can be solid, or hollow, or that the fibre feed spool could be rotated around the central member. The central member can also be removed from the fibre after the helix has been formed. The central structural member 12 can also be made from a helix in order to afford greater flexibility to the final cable.

It is well known that bending a fibre induces linear birefringence owing to bending stresses. This would naturally defeat the objective of making a fibre structure with a helical waveguiding region, namely to increase the circular birefringence, since as indicated previously, a large linear birefringence would be simultaneously produced. Bend-induced linear stress-birefringence is reduced by heating the fibre 11 to anneal it during or after it is wound on to the central member 12 (FIG. 6). It can also be reduced by using a fibre 11 with small outside diameter, since bending birefringence is proportional to the square of the fibre diameter.

Figure 3:
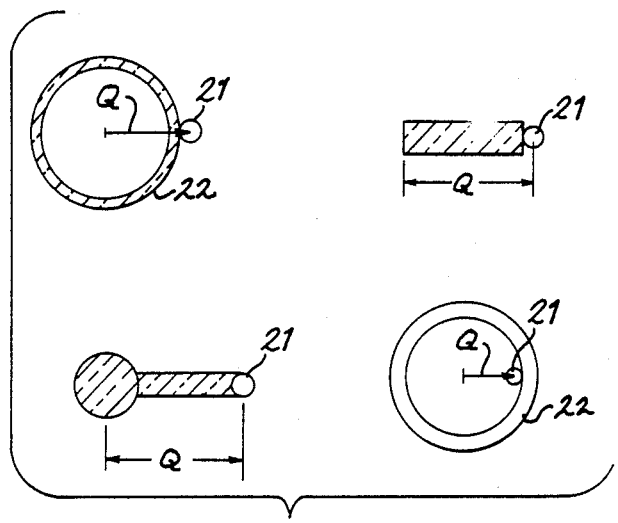
FIG. 3 shows alternative geometries of helical core fibres.

Returning to the fibre structure with a helical waveguiding region made by the preform spinning process, various geometries are possible and some suitable cross-sections are shown in FIG. 3. The fibre structure can be solid or hollow and it can have various geometrical shapes ranging from round to rectangular. All these geometries have in common an offset waveguiding region 21. In the hollow fibre structures this region 12 can be located inside, within or outside the capillary wall 22. Indeed, it need not be physically attached to the wall.

If the fibre structure is hollow and the waveguiding region is loosely attached to the inside of the capillary, then the fibre structure is likely to be buffered from linear birefringences resulting from external pressure and from stresses due to bending. Thus, in addition to the quenching of externally-indiced linear birefringences as a result of its high circular birefringence, the fibre structure is expected to be intrinsically less sensitive to packaging than if it were solid.

We claim:

1. Apparatus for sensing a magnetic field comprising a single-mode optical fibre structure having a central longitudinal axis and exhibiting sufficiently high circular birefringence for substantially quenching an influence of linear birefringence, said fibre structure including a single-mode waveguiding region, a longitudinal axis of which forms a helix around the central longitudinal axis of said fibre structure, with an offset of said longitudinal axis of said waveguiding region from said central longitudinal axis of said fiber structure being in the range of 10-300 μm and said helix having a pitch in the range of 0.1-10 mm.

2. Apparatus for sensing a magnetic field as claimed in claim 1 further comprising a cylindrical fiber former, said helical waveguiding region being disposed adjacent a surface of said cylindrical former.

3. Apparatus for sensing a magnetic field as claimed in claim 2 wherein said former is a tube and said waveguiding region is disposed adjacent an inner surface of said tube.

4. Apparatus for sensing a magnetic field as claimed in claim 2 wherein said waveguiding region is disposed adjacent an outer surface of said former.

5. Apparatus for sensing a magnetic field as claimed in claim 3 wherein the offset of the helical waveguiding region of said fibre structure is in the range 200-300 μm and its pitch is in the range 2-3 mm.

6. An electric current sensor apparatus for sensing an electric current, comprising a magnetic field sensing device that has a single-mode optical fibre structure having a central longitudinal axis and exhibiting sufficiently high circular birefringence for substantially quenching an influence of linear birefringence, said fibre structure including a single-mode waveguiding region, a longitudinal axis of which forms a helix around the central longitudinal axis of said fibre structure, with an offset of said longitudinal axis of said waveguiding region from said central longitudinal axis of said fiber structure being in the range of 10-300 μm and said helix having a pitch in the range of 0.1-10 mm.

* * * * *